US006496743B1

(12) United States Patent
Kokkosoulis et al.

(10) Patent No.: US 6,496,743 B1
(45) Date of Patent: Dec. 17, 2002

(54) METHOD AND APPARATUS FOR PROVIDING AUDIO SAMPLE RATE CONVERSION WITHIN A DATA-PROCESSING SYSTEM

(75) Inventors: George Kokkosoulis, Austin, TX (US); Daniel Anthony Temple, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/062,001

(22) Filed: Apr. 17, 1998

(51) Int. Cl.[7] .............................................. G06F 17/00
(52) U.S. Cl. ............................ 700/94; 381/119; 341/61
(58) Field of Search .......................... 381/98, 106, 119; 713/400; 704/500; 341/61; 700/94

(56) References Cited

U.S. PATENT DOCUMENTS

| 5,621,805 A | * | 4/1997 | Loh et al. ................... 381/119 |
| 5,907,295 A | * | 5/1999 | Lin ............................. 341/61 |
| 5,982,305 A | * | 11/1999 | Taylor ......................... 341/61 |
| 6,028,542 A | * | 2/2000 | Fukui et al. ................. 341/123 |

* cited by examiner

Primary Examiner—Curtis Kuntz
Assistant Examiner—Lun-See Lao
(74) Attorney, Agent, or Firm—Bracewell & Patterson, LLP; J. Bruce Schelkopf

(57) ABSTRACT

A method for providing audio sample rate conversion within a data-processing system is disclosed. An audio data stream having an input sample rate is first received. A sampling frequency ratio of the input sample rate to a selected output sample rate is determined, and this sampling frequency ratio is then utilized to compute output samples. The output samples are subsequently filtered with a lowpass filter and output at the selected output sample rate.

9 Claims, 3 Drawing Sheets

METHOD AND APPARATUS FOR PROVIDING AUDIO SAMPLE RATE CONVERSION WITHIN A DATA-PROCESSING SYSTEM

RELATED PATENT APPLICATION

The present patent application is related to a copending application U.S. Ser. No. 08/982,608 filed on Dec. 2, 1997, entitled "SYSTEM AND APPARATUS FOR AUDIO SAMPLE RATE CONVERSION WITHIN A DATA-PROCESSING SYSTEM".

BACKGROUND OF THE INVENTION

1. Technical Field

The present invention relates to a method and apparatus for data processing in general, and in particular to a method and apparatus for processing audio data within a data-processing system. Still more particularly, the present invention relates to a method and apparatus for providing audio sample rate conversion within a data-processing system.

2. Description of the Prior Art

Audio presentation is one of many integral features of a personal computer (PC) system equipped with multimedia capabilities. Typically, audio presentation support is provided by means of either adding an audio add-on board (commonly known as a sound card) to a system board of the PC system or integrating similar hardware within the system board. In both cases, integrated audio codecs are usually utilized to support the audio function. The problem with integrated audio codecs is that a relatively sensitive analog circuit is placed in close proximity to a relatively noisy digital audio circuit. As a result, the quality of audio presentation is not even comparable with that of an average home stereo.

In an effort to correct the above-mentioned problem, a specification known as the Audio Codec '97 (AC 97) was introduced, with the support of Intel Corporation and virtually all other audio integrated-circuit device manufacturers such as Analog Devices, National Semiconductor, etc. According to the AC 97 specification, analog and digital audio functions in a PC system environment must be performed by two separate components, namely, an analog audio codec and a digital audio controller. Moreover, interface and pinout of analog codecs are standardized in a way that an original equipment manufacturer (OEM) can mix and match analog codecs and digital controllers from different vendors. Additionally, the analog codec is defined to operate only at a sample rate of 48 kHz, utilizing up to 20-bit samples.

Despite of all the advantages provided by the AC 97 specification, the rigidity of 48 kHz sample rate presents some problems when interfacing legacy devices having a sample rate other than 48 kHz with an AC 97 compliant system. As an attempt to provide a solution to such problems, the abovementioned copending application describes a method and apparatus for providing audio sample rate conversion within a data-processing system having a digital audio controller that conforms to the AC 97 specification. It is an objective of the present disclosure to describe an improved method and apparatus to solve the same problem.

SUMMARY OF THE INVENTION

In view of the foregoing, it is therefore an object of the present invention to provide an improved method and apparatus for data processing.

It is another object of the present invention to provide an improved method and apparatus for processing audio data within a data-processing system.

It is yet another object of the present invention to provide an improved method and apparatus for providing audio sample rate conversion within a data-processing system.

In accordance with a method and apparatus of the present invention, an audio data stream having an input sample rate is first received. A sampling frequency ratio of the input sample rate to a selected output sample rate is determined, and this sampling frequency ratio is then utilized to compute output samples. The output samples are subsequently filtered with a lowpass filter and output at the selected output sample rate.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be implemented in a variety of data-processing systems operating under a number of different operating systems. The computer may be, for example, a personal computer, a midrange computer or a mainframe computer. In addition, the computer may be a stand-alone system or part of a network such as a local-area network (LAN) or a wide-area network (WAN). For the purpose of illustration, a preferred embodiment of the present invention, as described below, is implemented on a personal computer system, such as an Aptiva™ series manufactured by International Business Machines Corporation of Armonk, N.Y.

Figure 1:
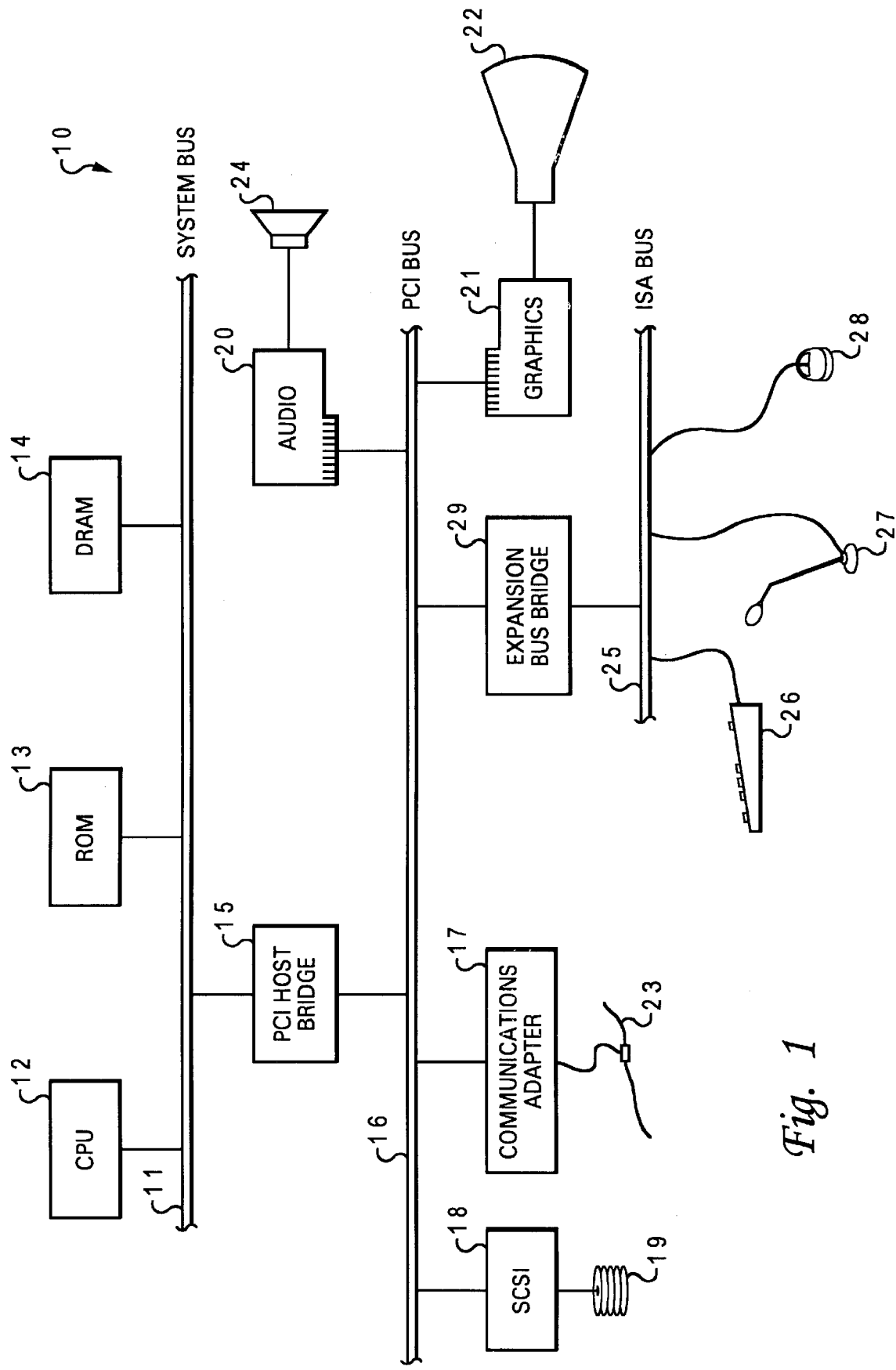
FIG. 1 is a block diagram of a personal computer system in which a preferred embodiment of the present invention may be utilized.

Referring now to the drawings and in particular to FIG. 1, there is depicted a block diagram of a personal computer system to which a preferred embodiment of the present invention is applicable. As shown, a central processing unit (CPU) 12, a read-only memory (ROM) 13, and a Dynamic Random Access Memory (DRAM) 14 are connected to a system bus 11 of a personal computer system 10. CPU 12, ROM 13, and DRAM 14 are also coupled to a PCI bus 16 of personal computer system 10 through a PCI host bridge 15. PCI host bridge 15 provides a low latency path through which CPU 12 may directly access PCI devices mapped anywhere within bus memory and/or I/O address spaces. PCI host bridge 15 also provides a high bandwidth path allowing PCI devices to directly access DRAM 14.

Also attached to PCI bus 16 is a communications adapter 17 and a small computer system interface (SCSI) 18. Communications adapter 17 connects personal computer system 10 to a local-area network (LAN) 23. SCSI 18 is utilized to control a high-speed SCSI disk drive 19. Expansion bus bridge 29, such as a PCI-to-ISA bus bridge, may be utilized for coupling an ISA bus 25 to PCI bus 16. As shown, a key-board 26, a microphone 27, and a mouse 28 may be attached to ISA bus 25 for performing certain basic I/O functions.

In addition, an audio adapter 20 and a graphics adapter 21 may be attached to PCI bus 16. Graphics adapter 21 controls visual output through a video monitor 22 and audio adapter 20 controls audio output through a speaker 24.

Figure 2:
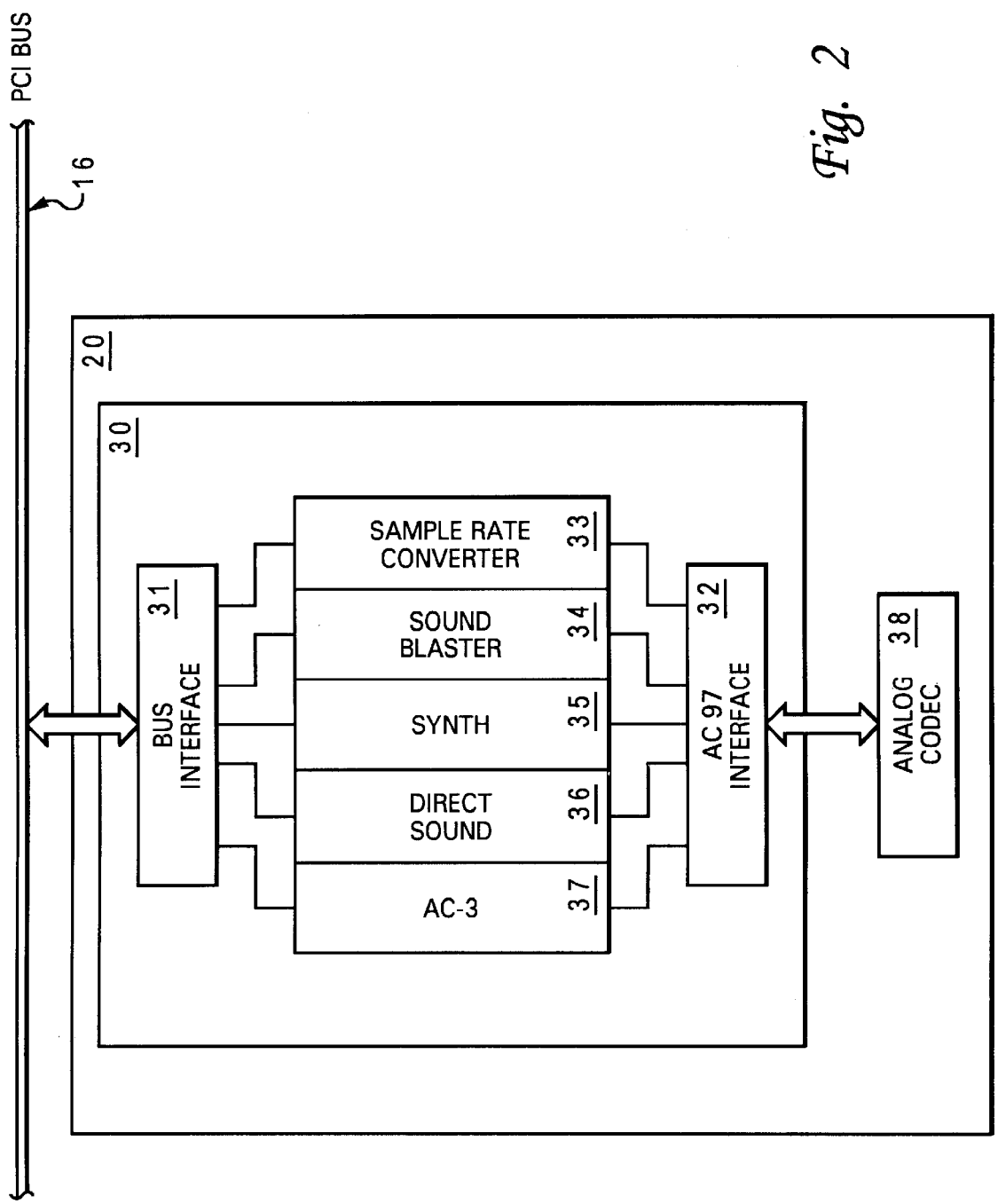
FIG. 2 is a block diagram of an audio adapter within the personal computer system of FIG. 1, in accordance with a preferred embodiment of the present invention.

With reference now to FIG. 2, there is illustrated a block diagram of an audio adapter 20 in accordance with a preferred embodiment of the present invention. Preferably, audio adapter 20 conforms to Audio Codec '97 (AC 97) Component Specification, revision 1.03, the pertinent section of which is incorporated herein by reference. An electronic copy of AC 97 can be found in the following Internet website: http://developer.intel.com/pc-supp/platform/ac97/index.htm. With a digital audio controller 30 and an analog codec 38, audio adapter 20 provides audio function support for personal computer system 10 of FIG. 1. As shown, digital audio controller 30 comprises a bus interface 31 coupled to PCI bus 16 and a point-to-point AC 97 interface 32 coupled to analog codec 38. A headphone or speaker may be connected to analog codec 38 for audio output. Analog codec 38 may also be connected to any serial peripheral device such as a modem, as is well-known in the art. Generally speaking, digital audio controller 30 communicates with analog codec 38 via a digital serial link known as an "AC-link" provided by AC 97 interface 32. All digital audio streams, optional modem line codec streams, and command/status information are communicated over AC 97 interface 32. A more detailed description of the AC-link can be found in Section 5 of the AC 97 component specification In addition to bus interface 31 and AC 97 interface 32, digital audio controller 30 also comprises a sample rate converter 33, a SoundBlaster™ module 34, a wavetable synthesis module 35, a DirectSound™ module 36, and an AC-3 module 37. SoundBlaster™ module 34 enables audio adapter 20 to have SoundBlaster™ compatibilities. Wavetable synthesis module 35 enhances sound qualities for music instrument digital interface (MIDI) inputs. DirectSound™ module 36 and AC-3 module 37 allow audio adapter 20 to be DirectX™ and Dolby Digital™ compatible.

A sample rate conversation algorithm, in accordance with a preferred embodiment of the present invention, may be implemented within sample rate converter 33. If an audio data stream is coming from PCI bus 16 to bus interface 31, the audio data stream will be sent to sample rate converter 33 for processing, if necessary. The processed audio data stream is then passed to analog codec 38 via AC 97 interface 32. On the other hand, if the audio data stream is coming from analog codec 38, the path for the audio data stream pass through AC 97 interface 32, then sample rate converter 33, and finally bus interface 31 before reaching PCI bus 16.

Since the required sample rate under AC 97 is 48 kHz, some commonly encountered examples of sample rate conversion are as follows: 48 kHz to 44.1 kHz; 48 kHz to 32 kHz; 48 kHz to 22.05 kHz; 48 kHz to 16 kHz; 48 kHz to 11.025 kHz; 48 kHz to 8 kHz; 44.1 kHz to 48 kHz; 32 kHz to 48 kHz; 22.05 kHz to 48 kHz; 16 kHz to 48 kHz; 11.025 kHz to 48 kHz; and 8 kHz to 48 kHz. The above list of examples is not exhaustive, and a method of sample rate conversion under the present invention may be adaptive in order to accommodate any other sample rates encountered.

In accordance with a preferred embodiment of the present invention, a sample rate conversion algorithm incorporates two main concepts: sample prediction and sample filtering.

Sample Prediction

Sample prediction requires a single variable to be known, and that variable is the ratio of an input sampling frequency (or input sample rate) to an output sampling frequency (or output sample rate), known as the sampling frequency ratio. Taking sample rate conversion from 11.025 kHz to 48 kHz as an example, the sampling frequency ratio for this conversion is 11025/48000, which can be reduced to 147/640. This "reduced" sampling frequency ratio, which represents the time difference ($\Delta t$) between samples of the output signal relative to the input signal, can be utilized to calculate output samples.

Sample prediction is based on the following process. Let counter i represent an index for output samples and counter j represent an index for input samples. Also, let there be a floating-point multiplier n having a range of $0 \leq n < 1$. Initially, the first input sample is directed to the output as an output sample. Then, counter i is incremented by one, and the sampling frequency ratio is added to an accumulative floating-point counter x that is initialized to zero. The integer portion of counter x becomes the index for the input sample j−1 whose value is subtracted from the value of the input sample j. The difference resulting from the subtraction is then multiplied by the decimal portion of counter x (i.e., multiplier n), and the result is added to the value of the input sample j−1. This process can be shown in equation form as follows:

$$\text{output}(i) = n \cdot [\text{input}(j) - \text{input}(j-1)] + \text{input}(j-1) \qquad (1)$$

This process is repeated for the entire duration of the input samples stream. After the number of predicted output samples reaches the length of a lowpass filter, the sample filtering process can begin.

Sample Filtering

Sample filtering is achieved by a mathematical operation known as "convolution." Basically, a convolution is a point-by-point dot product of digital audio signals and filter coefficients over an entire length of a filter. For example, in the present invention, coefficients from a finite impulse response (FIR) filter are convolved with magnitudes of an incoming digital audio data stream, in the time domain. Convolution in the time domain is more preferable for the present invention because it obviates the need to perform a time-consuming discrete Fourier transform (as well as an inverse Fourier transform) on the audio data stream that would be required if a similar operation were to be performed in a frequency domain. Because of low error, simple time domain mathematics, and guaranteed zero degree phase response, an ideal lowpass filter model is likely to be achieved. In addition, because time domain FIR filter coefficients are symmetrical and need to be calculated only once, the amount of memory required to store these coefficients is minimized. In order to further reduce errors, the FIR filter is designed with a very high cutoff frequency so that as much signal frequency content can be passed as possible, while leaving adequate frequency margin to guard against aliasing caused by under-sampling.

Incidentally, a single filter configuration will reduce the amount of memory needed to store all required coefficients as well as reducing the number of operations per convolution. Also, less leading signal data is lost (due to convolution) with a single filter configuration than the compounded loss associated with a multi-filter design. Overall, a single filter configuration performs far fewer arithmetic operations for a given sample rate conversion because the overall number of convolutions required may be reduced. While both single-filter and multi-filter techniques can be easily implemented in software to operate on a fixed-length signal, the single-filter technique is considerably faster and can be more easily implemented in hardware.

Figure 3:
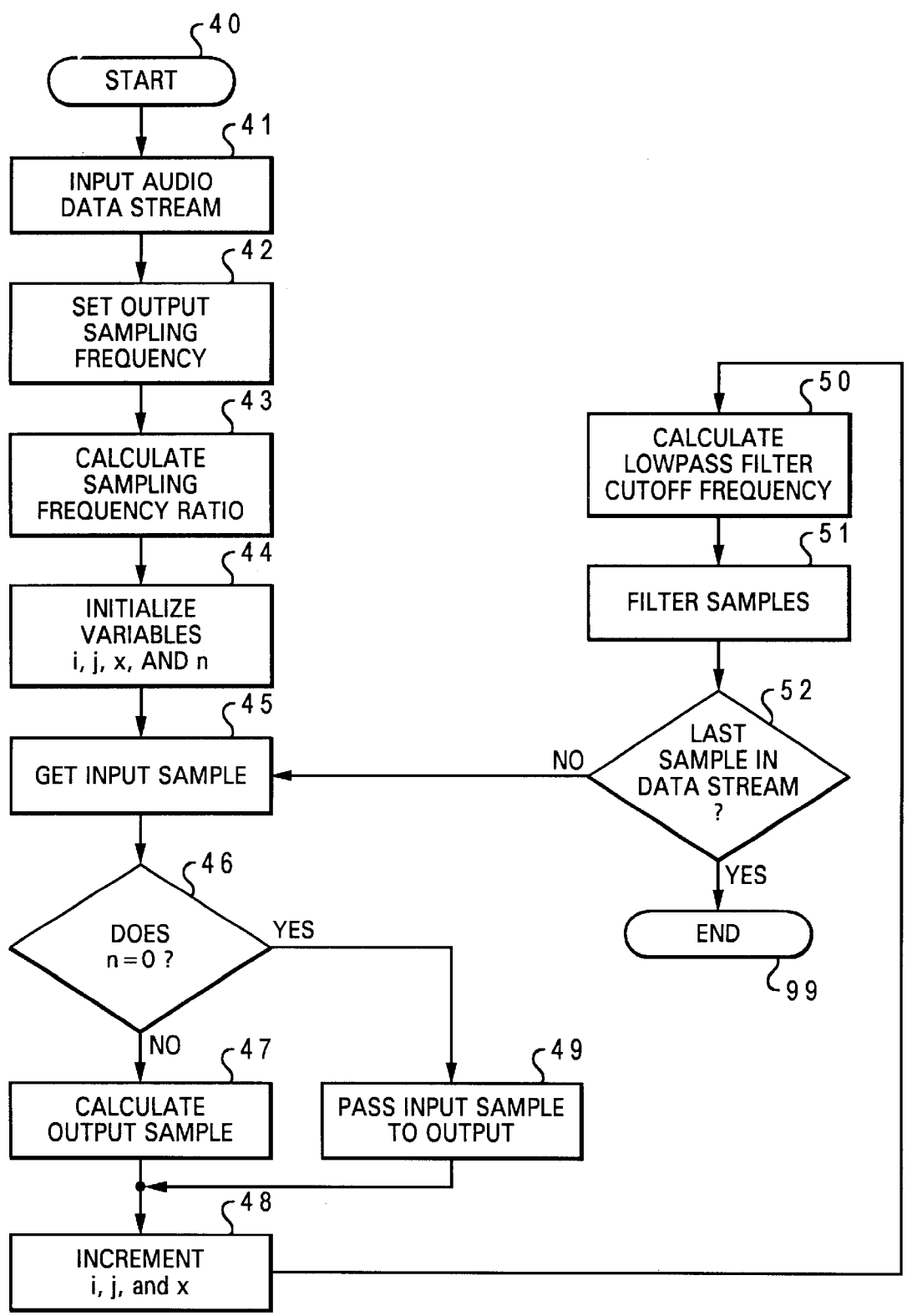
FIG. 3 is a high-level logic flow diagram of a method for providing audio sample rate conversion, in accordance with a preferred embodiment of the present invention.

Referring now to FIG. 3, there is illustrated a high-level logic flow diagram of a method for providing audio sample rate conversion within a data-processing system, in accordance with a preferred embodiment of the present invention. Starting at block 40, an audio data stream having an input sample rate $f_{in}$ is input into a digital audio controller, as shown in block 41. Referring back to FIG. 2, the audio data stream may come from either PCI bus 16 or analog codec 38. The output sample rate $f_{out}$ is then set (by a user) accordingly, as depicted in block 42. A sampling frequency ratio of the input sample rate to the output sample rate is then calculated, as illustrated in block 43. Variables i, j, x, and n are subsequently initialized, as shown in block 44. As mentioned previously, variables i, j, x, and n represent, respectively, an output sample index counter (which increments by 1), an input sample index counter (which increments by the change in the integer portion of counter x), an accumulative floating-point counter (which increments by the value of a sampling frequency ratio), and a wrap-around counter that counts the decimal portion of x.

After an input sample has been obtained, as shown in block 45, a determination is then made as to whether or not n equals to zero, as depicted in block 46. The sampling frequency ratio calculated in block 43 dictates when n equals zero. If n equals zero, the input sample is passed to the output directly as an output sample, as illustrated in block 49. For example, when the sampling frequency ratio is 147/640 in the case of a sample rate conversion from 11.025 kHz to 48 kHz, n is equal to zero every $640^{th}$ input sample, and thus every $640^{th}$ input sample will be considered as an output sample. However, if n does not equal zero, the output sample is calculated, as shown in block 47, with equation (1) mentioned previously. Then, variables i, j, and x are incremented, as depicted in block 48.

Subsequently, the cutoff frequently of a lowpass filter is calculated, as illustrated in block 50, and the output sample is passed through the lowpass filter, as shown in block 51. A determination is then made as to whether or not there are any more samples in the audio data stream, as depicted in block 52. If there are more samples in the audio data stream, the process returns to block 45; otherwise, the process exits at block 99.

As has been described, the present invention provides a method and apparatus for providing audio sample rate conversion within a data-processing system. In essence, the denominator of a sampling frequency ratio dictates which input samples are directly passed to the output, and the rest of the output samples will be calculated according to equation (1). Although the present invention is directed to the AC 97 specification, the principle as disclosed is also applicable to any general purpose audio processing system such as a digital versatile disk (DVD) system.

It is also important to note that although the present invention has been described in the context of a fully functional data-processing system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include without limitation recordable-type media such as floppy disks or CD ROMs, and transmission-type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for providing audio sample rate conversion within a data-processing system, said method comprising the steps of:

accepting an incoming audio data stream having an input sample rate;

determining a sampling frequency ratio of said input sample rate to a selected output sample rate;

utilizing said sampling frequency ratio to compute output samples by generating a proportional product between an input sample and said sampling frequency ratio, wherein said proportional product equals to $n$·[current input sample−previous input sample]+previous input sample, wherein n equals the decimal portion of said sampling frequency ratio; and outputting said output samples at said selected output sample rate.

2. The method according to claim 1, wherein said utilizing step further includes a step of passing an input sample as an output sample when said input sample coincides with said output sample in accordance with said sampling frequency ratio.

3. The method according to claim 1, wherein said method further includes a step of filtering said output samples with a lowpass filter.

4. An apparatus for providing audio sample rate conversion within a data-processing system, comprising:

means for accepting an incoming audio data stream having an input sample rate;

means for determining a sampling frequency ratio of said input sample rate to a selected output sample rate;

means for utilizing said sampling frequency ratio to compute output samples by generating a proportional product between an input sample and said sampling frequency ratio, wherein said proportional product equals to $n$·[current input sample−previous input sample]+previous input sample, wherein n equals the decimal portion of said sampling frequency ratio; and means for outputting said output samples at said selected output sample rate.

5. The apparatus according to claim 4, wherein said utilizing means further includes a means for passing an input sample as an output sample when said input sample coincides with said output sample in accordance with said sampling frequency ratio.

6. The apparatus according to claim 4, wherein said apparatus further includes a lowpass filter for filtering said output samples.

7. A computer program product residing on a computer usable medium for providing audio sample rate conversion within a computer system, said computer program product comprising:

program code means for accepting an incoming audio data stream having an input sample rate;

program code means for determining a sampling frequency ratio of said input sample rate to a selected output sample rate;

program code means for utilizing said sampling frequency ratio to compute output samples by generating a proportional product between an input sample and said sampling frequency ratio, wherein said proportional product equals to $n \cdot [\text{current input sample} - \text{previous input sample}] + \text{previous input sample},$ wherein n equals the decimal portion of said sampling frequency ratio; and program code means for outputting said output samples at said selected output sample rate.

8. The computer program product according to claim 7, wherein said program code means for utilizing further includes a program code means for passing an input sample as an output sample when said input sample coincides with said output sample in accordance with said sampling frequency ratio.

9. The computer program product according to claim 7, wherein said computer program product further includes a program code means for filtering said output samples.

\* \* \* \* \*